US010983005B2

(12) United States Patent
Wu et al.

(10) Patent No.: US 10,983,005 B2
(45) Date of Patent: Apr. 20, 2021

(54) SPECTROSCOPIC OVERLAY METROLOGY

(71) Applicant: Taiwan Semiconductor Manufacturing Co., Ltd., Hsinchu (TW)

(72) Inventors: Kai Wu, Hsin-Chu (TW); Hung-Chih Hsieh, Hsin-Chu (TW); Kai-Hsiung Chen, New Taipei (TW); Chih-Ming Ke, Hsinchu (TW); Yen-Liang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 97 days.

(21) Appl. No.: 15/623,665

(22) Filed: Jun. 15, 2017

(65) Prior Publication Data

US 2018/0172514 A1    Jun. 21, 2018

Related U.S. Application Data

(60) Provisional application No. 62/434,905, filed on Dec. 15, 2016.

(51) Int. Cl.
*G01J 3/28* (2006.01)
*G03F 9/00* (2006.01)
*G03F 7/20* (2006.01)

(52) U.S. Cl.
CPC .............. *G01J 3/28* (2013.01); *G01J 3/2803* (2013.01); *G03F 7/70616* (2013.01);
(Continued)

(58) Field of Classification Search
CPC .... G03F 7/70508; G03F 7/70633; G03F 9/70; G03F 9/7046
See application file for complete search history.

(56) References Cited

U.S. PATENT DOCUMENTS 7,391,513 B2    6/2008 Van Der Schaar et al.
7,858,404 B2   12/2010 Huang et al.
(Continued)

FOREIGN PATENT DOCUMENTS

WO    2011119577      9/2011
WO    2015185166     12/2015
(Continued)

OTHER PUBLICATIONS

Keith Gibbs, "Diffraction gratings", http://www.schoolphysics.co.uk/age16l9/Wave%20properties/Diffraction/text/Diffraction_grating/index.html, 2012 (Year: 2012).*
(Continued)

*Primary Examiner* — Maurice C Smith
(74) *Attorney, Agent, or Firm* — Haynes and Boone, LLP

(57) ABSTRACT

A spectroscopic overlay metrology system and corresponding spectroscopic overlay metrology methods are disclosed herein for improving overly measurement accuracy, optimizing overlay recipes, and/or minimizing (or eliminating) asymmetry-induced overly error from overlay measurements. An exemplary method includes generating a diffraction spectrum by an overlay target from incident radiation having more than one wavelength. The diffraction spectrum includes a plurality of positive ordered diffracted beams and a plurality of negative ordered diffracted beams that are separated by wavelength, such that the diffraction spectrum includes more than one wavelength of a positive order and a negative order. The method further includes collecting intensity information associated with the diffraction spectrum generated by the overlay target from the incident radiation, and generating overlay information from the collected intensity information, where the overlay information includes contributions from asymmetry-induced overlay error. In some implementations, the method includes opti-
(Continued)

mizing an overlay recipe based on the generated overlay information.

19 Claims, 9 Drawing Sheets

(52) U.S. Cl.
CPC ........ *G03F 7/70633* (2013.01); *G03F 9/7065* (2013.01); *G01J 2003/2806* (2013.01)

(56) References Cited

U.S. PATENT DOCUMENTS

| | | | |
|---|---|---|---|
| 8,183,701 B2 | 5/2012 | Shih et al. | |
| 8,250,497 B2 | 8/2012 | Hsu et al. | |
| 8,339,595 B2 | 12/2012 | Den Boef | |
| 8,837,810 B2 | 9/2014 | Chen et al. | |
| 8,994,944 B2 | 3/2015 | Cramer et al. | |
| 9,304,403 B2 | 4/2016 | Lin et al. | |
| 9,355,200 B2 | 5/2016 | Chen et al. | |
| 2010/0007863 A1* | 1/2010 | Jordanoska | G01N 21/47 355/53 |
| 2010/0091284 A1* | 4/2010 | Mieher | G01N 21/956 356/401 |
| 2011/0255066 A1* | 10/2011 | Fuchs | G03F 7/70633 355/67 |
| 2012/0013881 A1 | 1/2012 | Den Boef et al. | |
| 2012/0224176 A1 | 9/2012 | Hammond | |
| 2013/0148121 A1* | 6/2013 | Den Boef | G03F 7/70633 356/401 |
| 2014/0240706 A1 | 8/2014 | Lee et al. | |
| 2015/0346605 A1* | 12/2015 | Den Boef | G03F 7/705 438/401 |
| 2016/0161864 A1 | 6/2016 | Middlebrooks et al. | |
| 2016/0370717 A1 | 12/2016 | Den Boef et al. | |
| 2017/0268869 A1* | 9/2017 | Levinski | G01B 9/0201 |

FOREIGN PATENT DOCUMENTS

| | | |
|---|---|---|
| WO | 2016083076 | 6/2016 |
| WO | 2016162228 | 10/2016 |
| WO | 2016202695 | 12/2016 |

OTHER PUBLICATIONS

Adel, Mike, et al. "Diffraction Order Control in Overlay Metrology: A Review of the Roadmap Options." Proc. of SPIE vol. 6922, 692202, 2008 SPIE Digital Library, 19 pages.

Dasari, Prasad, et al. "Diffraction Based Overlay Metrology for Double Patterning Technologies," Proc. SPIE 7272, Metrology, Inspection and Process Control for Microlithography XXIII, 727212 (Mar. 24, 2009), 23 pages.

* cited by examiner

SPECTROSCOPIC OVERLAY METROLOGY

This application is a non-provisional application of and claims benefit of U.S. Provisional Patent Application Ser. No. 62/434,905, filed Dec. 15, 2016, the entire disclosure of which is incorporated herein by reference.

BACKGROUND

Integrated circuit (IC) design becomes more challenging as IC technologies continually progress towards smaller features. For example, an IC device includes a sequence of patterned layers and un-patterned layers that combine to form one or more IC features. Misalignment between the various layers can cause performance issues and even potentially cause an IC device to fail due to, for example, a short caused by misaligned layers. Overlay (generally referring to layer-to-layer positioning) of the various layers is thus critical to ensuring the IC device and/or IC features function properly, and in particular, function according to design requirements for the IC device and/or IC feature. Although existing overlay metrology techniques have been generally adequate for their intended purposes, they have not been entirely satisfactory in quickly and accurately assessing overlay issues for advanced technology nodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion

DETAILED DESCRIPTION

Figure 1A:
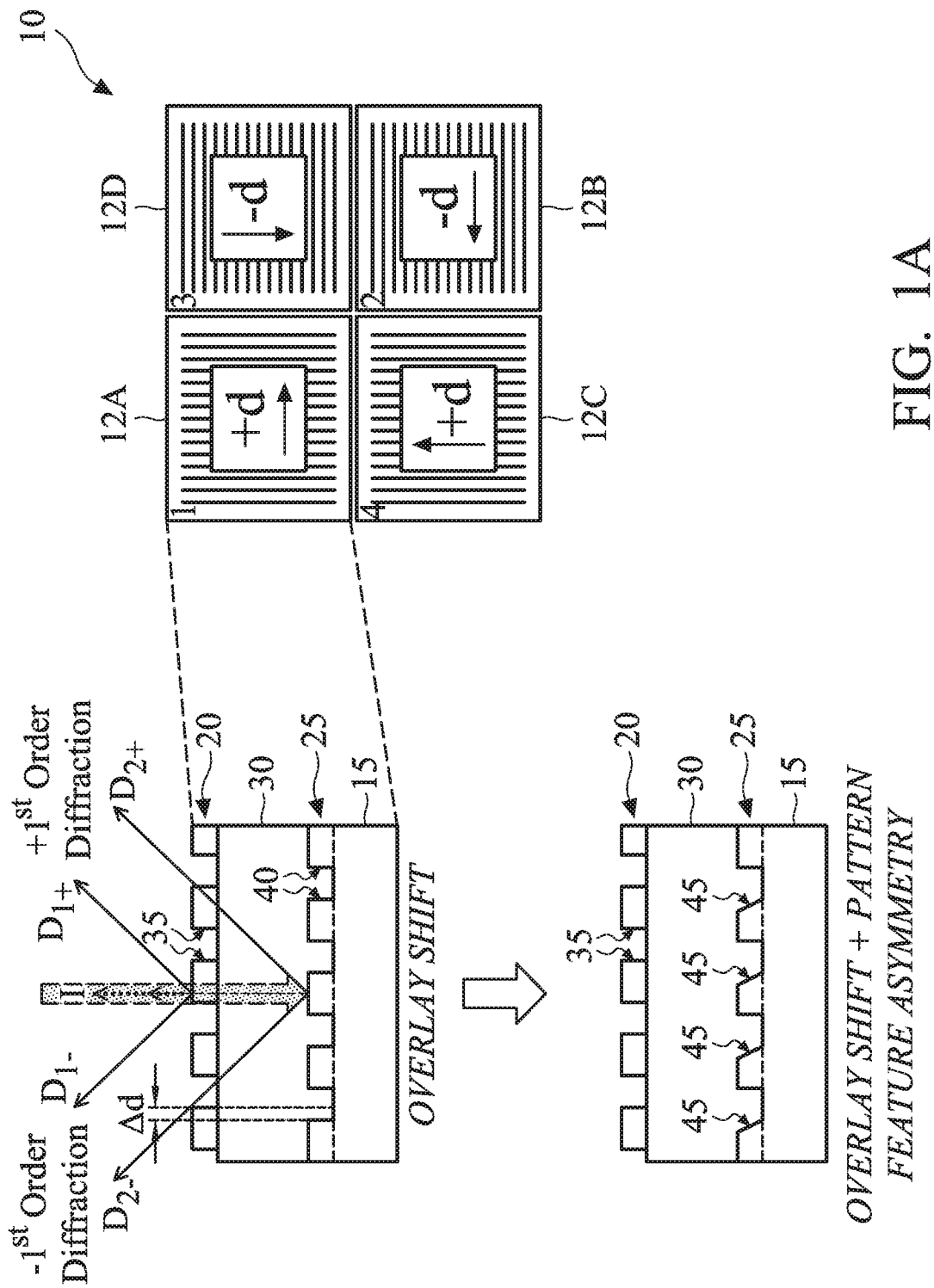
FIG. 1A is a simplified schematic depiction of an overlay target according to various aspects of the present disclosure.

The present disclosure relates generally to overlay metrology associated with integrated circuit device fabrication, and more particularly, to spectroscopic overlay metrology.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a simplified schematic depiction of an overlay target 10 according to various aspects of the present disclosure. Overlay target 10 is formed on a workpiece (such as a wafer or a substrate) undergoing integrated circuit (IC) processing to form an IC device. Overlay target 10 includes an overlay pattern 12A, an overlay pattern 12B, an overlay pattern 12C, and an overlay pattern 12D. Each overlay pattern 12A-12D includes a pair of patterned layers having a defined offset there between, where the pair of patterned layers is formed over a substrate 15. For example, overlay patterns 12A-12D include a first patterned layer 20 disposed over a second patterned layer 25, where first patterned layer 20 is offset from second patterned layer 25 by a target bias ($\Delta d$) (also referred to as an overlay shift and/or an overlay distance). Both first patterned layer 20 and second patterned layer 25 are disposed over substrate 15. In the depicted embodiment, overlay patterns 12A-12D are each configured with the target bias in different directions. For example, where target bias is defined in an x-direction and a y-direction, overlay pattern 12A includes a pair of patterned layers offset in a positive x-direction (for example, +d), overlay pattern 12B includes a pair of patterned layers offset in a negative x-direction (for example, −d), overlay pattern 12C includes a pair of patterned layers offset in a positive y-direction (for example, +d), and overlay pattern 12D includes a pair of patterned layers offset in a negative y-direction (for example, −d). In the depicted embodiment, overlay target 10 is a diffraction-based overlay (DBO) grating target, where first patterned layer 20 is a first periodic structure (such as a first grating) and second patterned layer 25 is a second periodic structure (such as a second grating), which are designed with target bias $\Delta d$. In some implementations, overlay target 10 is a micro-DBO ($\mu$DBO) grating target, where a spectroscopic overlay metrology system can illuminate overlay patterns 12A-12D with a single shot, thereby gathering overlay information from overlay patterns 12A-12D simultaneously.

First patterned layer 20 and second patterned layer 25 include any suitable material, such as resist (or photoresist) material, a dielectric material, a semiconductor material, a conductive material, other suitable material, or combinations thereof. In some implementations, first patterned layer 20 and/or second patterned layer 25 include a transmissive material. Any suitable lithography, deposition, and/or etching processes, such as those implemented during IC processing, can be implemented to form first patterned layer 20 and second patterned layer 25 over substrate 15. In some implementations, first patterned layer 20 and second patterned layer 25 are formed in a scribe line of an IC, where first patterned layer 20 and/or second patterned layer 25 correspond with respective patterned layers of the IC. In some implementations, second patterned layer 25 corresponds with a patterned layer of the IC, which is a part of an IC feature, and first patterned layer 20 corresponds with a patterned resist layer formed over substrate 15, which is used for patterning a layer of the IC overlying the patterned layer. One or more layers can be disposed between first patterned layer 20 and second patterned layer 25. For example, in FIG. 1A, a material layer 30 is disposed between first patterned layer 20 and second patterned layer 25. In the depicted embodiment, material layer 30 includes a dielectric material, though the present disclosure contemplates material layer 30 including any material that minimally impacts (and, in some implementations, does not impact) gathering overlay information from first patterned layer 20 and second patterned layer 25. Further, though depicted as a single layer, material layer 30 may alternatively include multiple material layers.

During IC fabrication, overlay target 10 is used to ensure proper alignment between layers of the IC device, where overlay generally refers to a relative position (or alignment) between two or more layers of the IC device. For example, after fabricating overlay target 10 (each layer of which corresponds with an IC layer of the workpiece or an IC layer of the workpiece to be formed), a spectroscopic overlay metrology system illuminates overlay target 10 with incident radiation I, impinging first patterned layer 20 and second patterned layer 25, such that first patterned layer 20 and second patterned layer 25 each produce a diffraction spectrum. For example, incident radiation I diffracted by first patterned layer 20 includes a positive first ($+1^{st}$) order diffraction beam $D_{1+}$ and a negative first ($-1^{st}$) order diffraction beam $D_{1-}$, and incident radiation I diffracted by second patterned layer 25 includes a $+1^{st}$ order diffraction beam $D_{2+}$ and a $-1^{st}$ order diffraction beam $D_{2-}$. The present disclosure contemplates that the diffraction spectrum can include any order diffraction beams, including zero order diffraction beams and/or higher ordered diffraction beams. The spectroscopic overlay metrology system measures (collects) intensities corresponding with the diffraction spectrum (here, $+1^{st}$ order diffraction beams and $-1^{st}$ order diffraction beams), which can be used to analyze one or more properties of the diffraction spectrum. In some implementations, an intensity of the diffraction spectrum is analyzed as a function of a wavelength of incident radiation.

The spectroscopic overlay metrology system then generates a measured overlay shift based on the collected intensities corresponding with the diffraction spectrums. For example, where no overlay shift exists between first patterned layer 20 and second patterned layer 25, the spectroscopic overlay metrology system will detect no intensity difference in the diffraction spectrum produced by first patterned layer 20 and the diffraction spectrum produced by second patterned layer 25. In the present example, where a known overlay shift exists between first patterned layer 20 and second patterned layer 25, the spectroscopic overlay metrology system will detect an intensity difference in the diffraction spectrum (for example, the $+1^{st}$ order and $-1^{st}$ orders) produced by first patterned layer 20 and the diffraction spectrum (for example, the $+1^{st}$ order and $-1^{st}$ orders) produced by second patterned layer 25. Such intensity difference corresponds with a measured overlay shift, which can be used to generate an overlay measurement, such as an overlay. In some implementations, the overlay measurement indicates a difference between the measured overlay shift and a known overlay shift (here, target bias $\Delta d$). Based on the overlay measurement, the spectroscopic overlay metrology system can then determine whether the overlay measurement is acceptable, such that proper alignment can be achieved between patterned layers of the IC device. For example, when the overlay measurement meets a predefined threshold (for example, within ±5%), IC fabrication can continue using the IC layer corresponding with first patterned layer 20. When the overlay measurement fails to meet the predefined threshold, IC fabrication can continue with removing the IC layer corresponding with first patterned layer 20, and then forming another IC layer having a corresponding patterned layer over second patterned layer 25, which can be used for further processing if proper alignment exists between the overlay layers.

Overlay patterns 12A-12D are depicted as substantially symmetrical—in particular, features of first patterned layer 20 and second patterned layer 25 are substantially similar and symmetrical. For example, first patterned layer 20 includes rectangular-shaped features 35, and second patterned layer 25 includes rectangular-shaped features 40. The similarity and symmetry between features of first patterned layer 20 and second patterned layer 25 ensures symmetric diffraction spectrums, such that any differences between the known overlay shift and the measured overlay shift (resulting from intensity differences in the diffraction spectrums of first patterned layer 20 and the second patterned layer 25) can be assumed to represent overlay (often referred to as overlay error) resulting from improper alignment between the IC layers corresponding overlay target 10. Such provides accurate, reliable overlay measurements. However, in reality, process variations during fabrication of overlay patterns 12A-12D often result in first patterned layer 20 and/or second patterned layer 25 having asymmetrical features. For example, processing variations may result in second patterned layer 25 having trapezium-shaped features 45 as depicted, inducing asymmetry between the diffraction spectrum of second patterned layer 25 relative to the diffraction spectrum of first patterned layer 20. This asymmetry induces error into overlay measurements, such that any differences between the known overlay shift and the measured overlay shift represent not only overlay error resulting from improper alignment between the IC layers corresponding with overlay target 10, but also asymmetry-induced overlay error that needs to be accounted for when evaluating whether the IC layers are properly aligned.

To minimize (or eliminate) asymmetry-induced overlay error in overlay measurements, accurate overlay metrology relies on optimizing overlay measurement conditions (collectively referred to as an overlay recipe) of the spectroscopic overlay metrology system. The overlay recipe specifies various overlay measurement conditions (parameters) for configuring the spectroscopic overlay metrology system to minimize sensitivity of the overlay measurements to asymmetry-induced overlay error and/or other process-induced errors. For example, the overlay recipe can specify a particular wavelength(s) of incident radiation, a polarization (s) of incident radiation, an incident angle(s) of incident radiation relative to the workpiece and/or the overlay target, and/or any other parameter(s) that can be tuned to optimize the overlay measurements. Different diffraction spectrum (and therefore different overlay measurements) will be produced depending on wavelength and/or polarization of incident radiation, such that any overlay recipe optimization process must separately analyze each wavelength at each polarization to identify a wavelength(s) and/or polarization (s) that will optimize the overlay measurements. In some implementations, an optimal overlay recipe will minimize asymmetry-induced overlay error while ensuring an intensity of the diffraction spectrum is sufficiently detectable for analysis. Typically, a single, separate measurement process must be performed for each wavelength at each polarization during an overlay recipe optimization process. For example, the spectroscopic overlay metrology system illuminates an overlay target with incident radiation of a particular wavelength having a particular polarization, such that the overlay target is irradiated with a monochromatic radiation beam (in other words, radiation of a single wavelength). The spectroscopic overlay metrology system then collects intensity information associated with a diffraction spectrum produced by the overlay target from the particular wavelength having the particular polarization and generates overlay information from the collected intensity information. The spectroscopic overlay metrology system then continues to perform such process with incident radiation of the particular wavelength at each potential polarization state, and then continues to perform such process with incident radiation of each additional potential wavelength at each polarization state. In some implementations, the spectroscopic overlay metrology system also performs such measurements and/or analysis for multiple overlay targets at different areas of a workpiece.

Figure 1B:
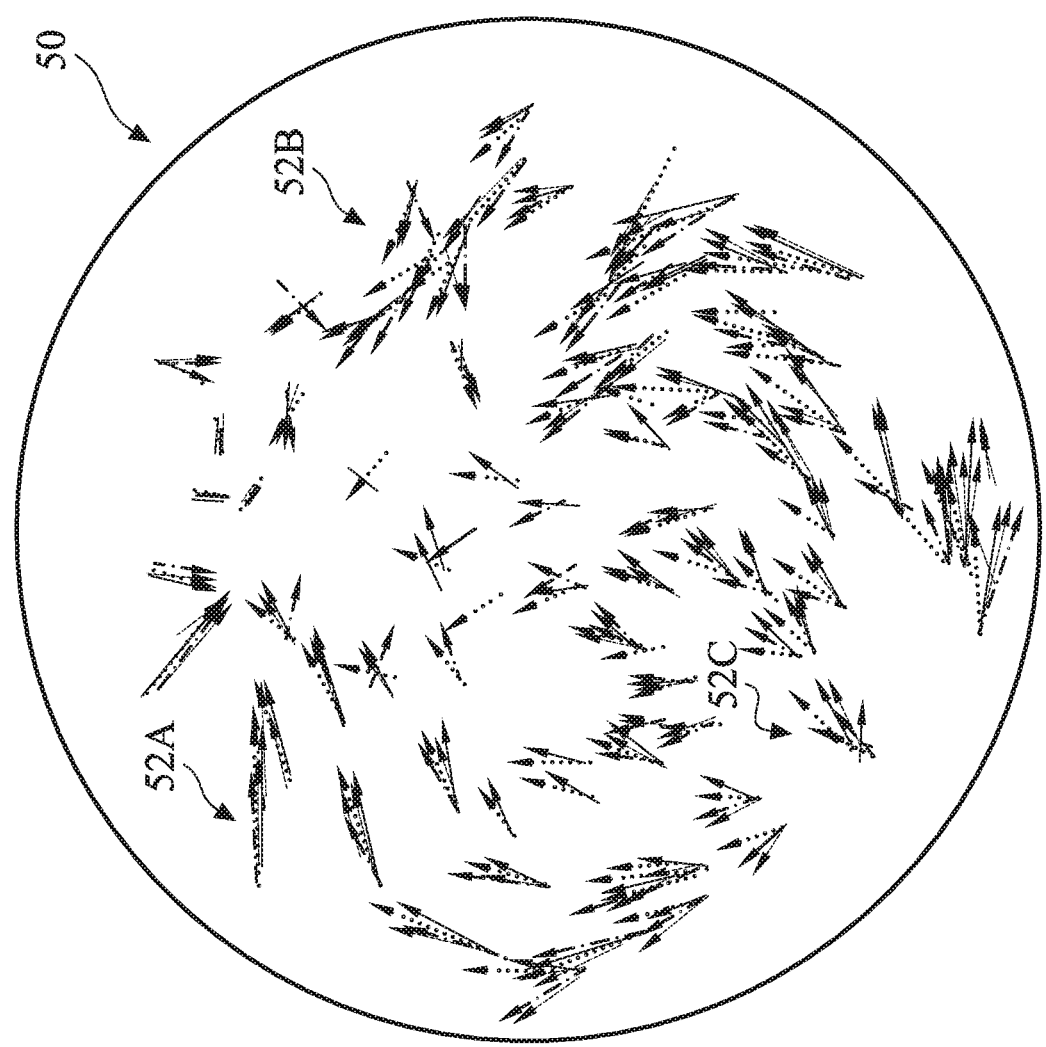
FIG. 1B is a simplified schematic depiction of an overlay map according to various aspects of the present disclosure.

FIG. 1B is a simplified schematic depiction of an overlay map 50, which can be generated during the overlay recipe optimization process, according to various aspects of the present disclosure. Overlay map 50 schematically depicts overlays obtained using different overlay recipes at different overlay areas of a workpiece (for example, a wafer), such as an overlay area 52A, an overlay area 52B, and an overlay area 52C. Each overlay area includes various vectors, each vector representing a direction and a magnitude of an overlay obtained by a spectroscopic overlay metrology system implementing an overlay recipe using incident radiation of a particular wavelength. In some implementations, the spectroscopic overlay metrology system implemented overlay recipes using incident radiation having wavelengths from about 400 nm to about 900 nm. For example, each overlay area includes overlays obtained when spectroscopic overlay metrology system used seven different overlay recipes, each overlay recipe illuminating an overlay target with incident radiation of a different wavelength, such as 450 nm, 500 nm, 550 nm, 600 nm, 650 nm, 700 nm, and 750 nm. As evident in overlay map 50, different wavelengths generate different overlays, where each overlay vector at overlay area 52A, overlay area 52B, and overlay area 52C corresponds with a specific wavelength. The spectroscopic overlay metrology system can thus analyze the various overlay vectors to select a wavelength(s) of incident radiation that is least sensitive to asymmetry, minimizing (or eliminating) asymmetry-induced overlay error. The spectroscopic overlay metrology system may also consider other key performance indicators (KPIs) when selecting the wavelength(s). During IC fabrication, overlay measurements are then performed using the selected wavelength(s) of incident radiation.

Throughput of the spectroscopic overlay metrology system largely depends on measurement time, which includes time involved with overlay recipe optimization and/or selection. As IC technologies continually progress towards smaller feature sizes (for example, to 15 nanometers, 12 nanometers, 10 nanometers, and below), process variations and/or material variations profoundly affect quality and/or detectability of diffraction spectrum gathered by the spectroscopic overlay metrology system, such that optimal overlay recipes are constantly changing wafer-to-wafer, lot-to-lot, and/or device-to-device. Overlay recipes are particularly susceptible to material stack changes, such as stack thickness, stack optical properties, and/or stack asymmetry, of overlay targets. In some implementations, where a lot of wafers are processed to form an IC device and an overlay target is fabricated on each wafer, material stack changes that can prevent robust overlay metrology include changes between wafers in thicknesses, optical properties, and/or symmetries of the layers forming the overlay targets. For example, where the overlay targets are similar to overlay target 10, material changes between wafers in first patterned layer 20, second patterned layer 25, and/or material layer 30 will often require modifications to an overlay recipe implemented by the spectroscopic overlay metrology system for gathering overlay information from the wafers.

Figure 1C:
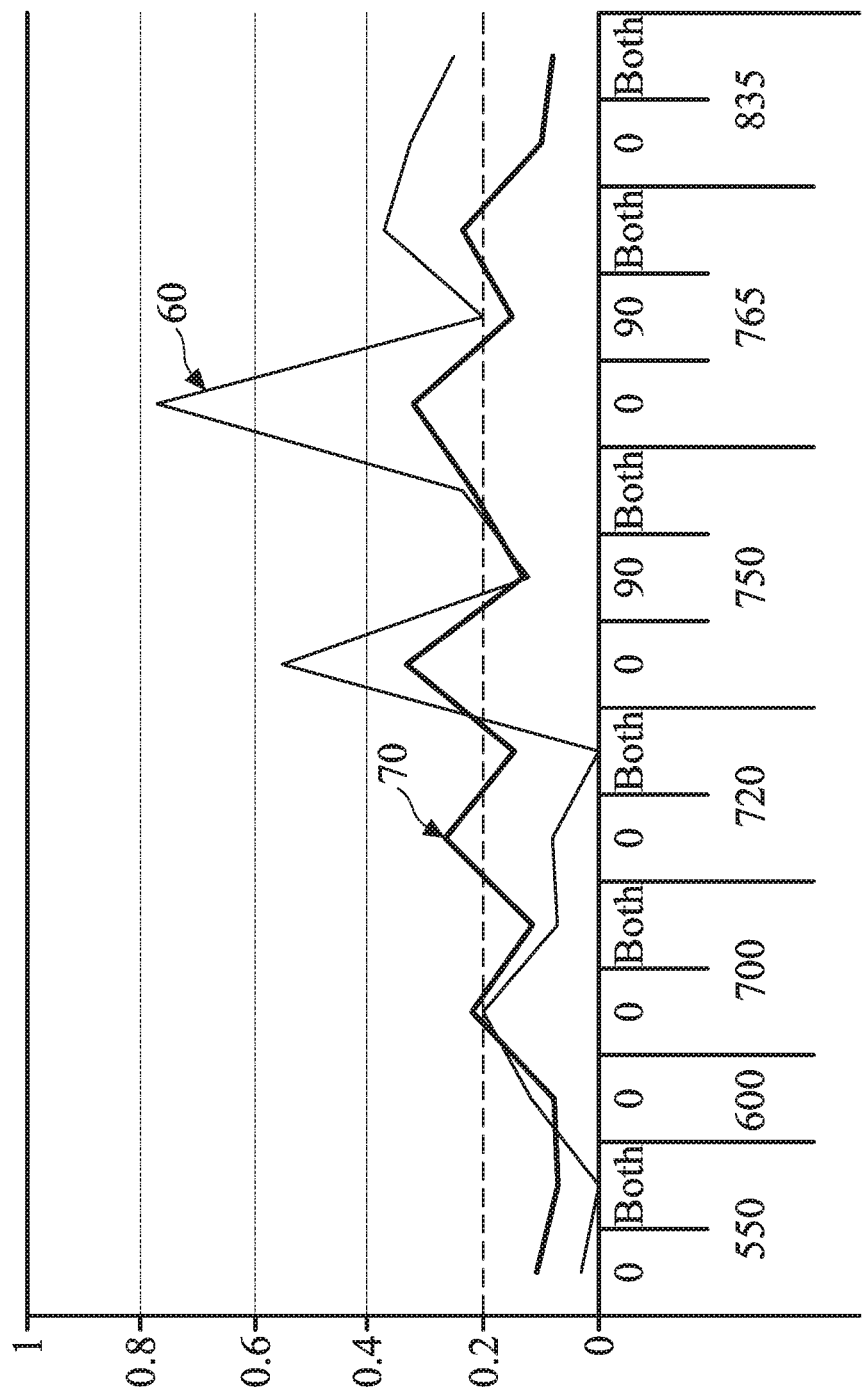
FIG. 1C includes simplified graphs illustrating stack sensitivity as a function of a wavelength of an overlay recipe according to various aspects of the present disclosure.

Wavelength detectability changes in response to material stack changes. FIG. 1C includes simplified graphs illustrating stack sensitivity as a function of a wavelength of an overlay recipe according to various aspects of the present disclosure. Stack sensitivity (SS) is an index for overlay measurement detectability, which is a function of material stack characteristics, overlay target design, and/or overlay measurement conditions (for example, measurement wavelength and/or measurement polarization used for illuminating the overlay target). In some implementations, stack sensitivity generally measures changes in an intensity of a diffraction signal (or diffraction spectrum) as a function of changes in material stack characteristics. In some implementations, stack sensitivity is proportional to $(I^{+1st\ order} - I^{-1st\ order})/(I^{+1st\ order} - I^{-1st\ order})$, where I is an intensity. In FIG. 1C, a graph 60 and a graph 70 each illustrate stack sensitivity as a function of different incident radiations having different polarization states, each of which can be implemented in an overlay recipe for gathering overlay information from overlay targets. Graph 60 evaluates stack sensitivity before any material stack changes, and graph 70 evaluates stack sensitivity after material stack changes. In some implementations, graph 60 corresponds with measurements performed on an overlay target of a first wafer (or, in some implementations, a first set of wafers), and graph 70 corresponds with measurements performed on an overlay target of a second wafer (or, in some implementations, a second set of wafers), where the overlays targets of the first wafer and the second wafer are the same except for material stack changes resulting from processing variations. In some implementations, the overlay targets are similar to overlay target 10, where the material stack changes arising from processing are exhibited in first patterned layer 20, second patterned layer 25, and/or material layer 30.

Each wavelength of incident radiation (here, 550 nm, 600 nm, 700 nm, 720 nm, 750 nm, 765 nm, and 835 nm) is polarized parallel (0) relative to the overlay target, perpendicular (90) relative to the overlay target, or both parallel and perpendicular (both) to the overlay target. A direction of polarization (such as parallel or perpendicular) may be relative to a direction of periodicity of patterned layers of the overlay target (such as first patterned layer 20 and/or patterned layer 25 of overlay target 10). In implementations where a stack sensitivity of greater than about 0.2 is needed for optimizing overlay measurements, graph 60 and graph 70 indicate various incident radiations that can be implemented in an overlay recipe. Graph 60 indicates that incident radiation of 750 nm having a parallel polarization state, 750 nm having both polarization states, 765 nm having a parallel polarization state, 765 nm having both polarization states, 835 nm having a parallel polarization state, and/or 835 nm having both polarization states provide sufficient stack sensitivity, ensuring detectability of diffraction spectrums from incident radiation having such wavelengths and polarization states. In contrast, after material stack changes have occurred, graph 70 indicates that an incident radiation of 835 nm having a parallel polarization state and 835 nm having both polarization state no longer provides sufficient stack sensitivity (in particular, such incident radiation now corresponds with a stack sensitivity of less than about 0.2). In such instances, the spectroscopic overlay metrology system would be unable to detect diffraction spectrum produced by overlay targets from incident radiation of 835 nm having a parallel polarization state or 835 nm having both polarization states, such that any overlay recipes using such incident radiation would be unsuitable for optimizing overlay measurements associated with overlay targets exhibiting the material stack changes. Graph 70 also indicates that some incident radiations provide higher stack sensitivity, such as incident radiation of 700 nm having a parallel polarization state (for example, from about 0.2 to about 0.25) and 720 nm having a parallel polarization state (for example, from about 0.25 to about 0.3). Such incident radiations may no longer optimize overlay measurements. For example, in some implementations, stack sensitivity less than about 0.2 indicates that diffraction spectrum produced by overlay targets from incident radiation of such wavelengths and/or polarization states will include too much noise, such that the spectroscopic overlay metrology system cannot accurately and sufficiently detect and/or measure the diffraction spectrum.

Figure 1D:
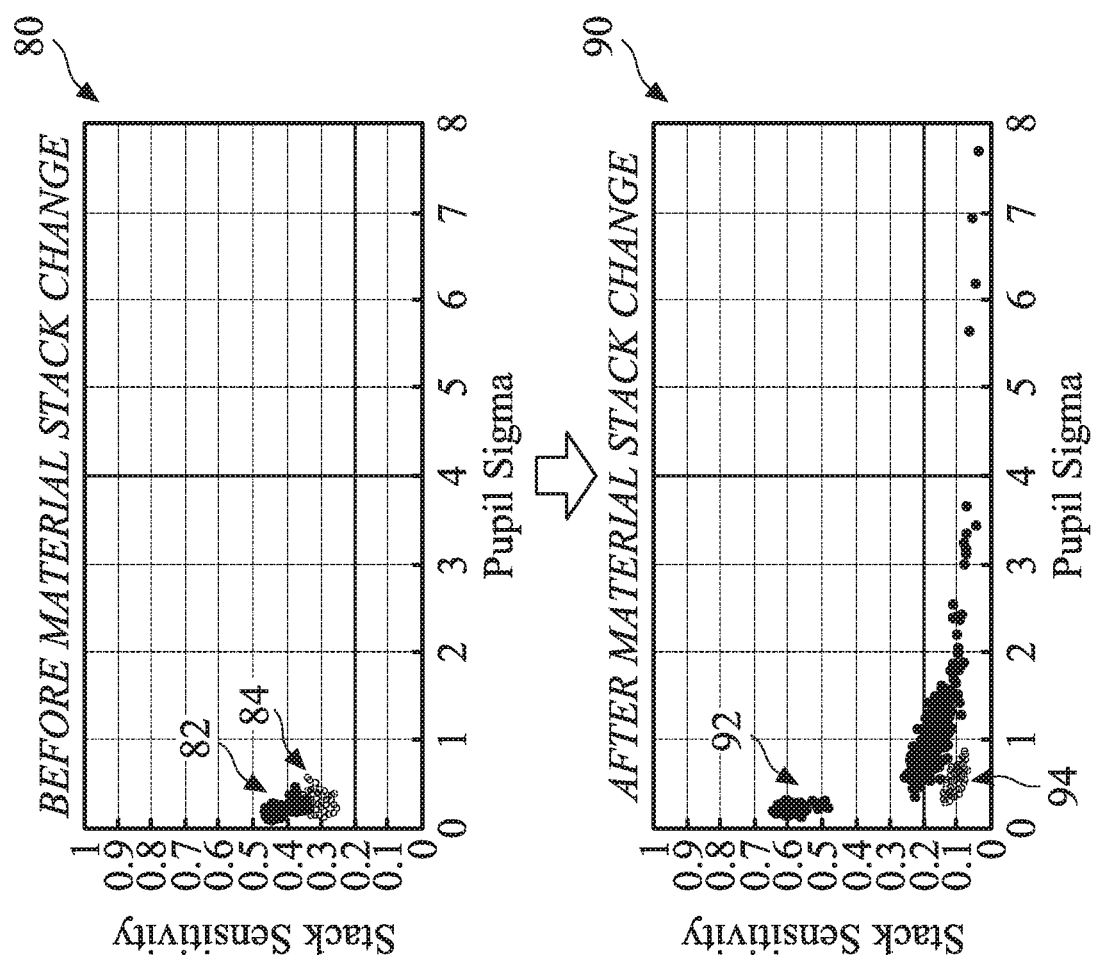
FIG. 1D includes simplified graphs illustrating stack sensitivity as a function of a knowledge performance indicator according to various aspects of the present disclosure.

Key performance indicators (KPIs) also change in response to material stack changes. FIG. 1D includes simplified graphs illustrating stack sensitivity as a function of a key performance indicator according to various aspects of the present disclosure. In FIG. 1D, a graph 80 and a graph 90 each illustrate stack sensitivity and pupil sigma, where pupil sigma generally refers to a standard deviation of overlay measurements corresponding with one or more detectors (for example, pixels) for a given overlay target. Graph 80 evaluates stack sensitivity before any material stack changes, and graph 90 evaluates stack sensitivity after material stack changes. Graph 80 includes a first set of measurements 82 and a second set of measurements 84, and graph 90 includes a third set of measurements 92 (which correspond with first set of measurements 82) and a fourth set of measurements 94 (which correspond with second set of measurements 84). First set of measurements 82 and second set of measurements 84 were taken from overlay targets of a first wafer (or first set of wafers), where first set of measurements 82 and second set of measurements 84 were gathered using different overlay recipes, such as incident radiation having different wavelengths and/or different polarization states. Third set of measurements 92 and fourth set of measurements 94 were taken from overlay targets of a second wafer (or second set of wafers), where third set of measurements 92 were gathered using the same overlay recipe that was used for gathering the first set of measurements 82, and fourth set of measurements 94 were gathered using the same overlay recipe that was used for gathering second set of measurements 84. The overlay targets of the second wafer were the same (or substantially similar) to the overlay targets of the first wafer. In implementations where a stack sensitivity of greater than about 0.2 is needed for optimizing overlay measurements, graph 80 and graph 90 illustrate how material stack changes can require overlay recipe re-optimization. In particular, graph 80 indicates that the selected wavelength(s) of the overlay recipes facilitates sufficient detectability of an intensity of diffraction spectrum generated by an overlay target from incident radiation of the selected wavelength(s). However, after material stack changes occur with the overlay target, graph 90 indicates that that the selected wavelength(s) of the overlay recipes result in too much noise in the diffraction spectrum generated by the overlay target from incident radiation of the selected wavelength(s) (see, for example, third set of measurements 92) or insufficient detectability of an intensity of the diffraction spectrum (see, for example, fourth set of measurements 94). The spectroscopic overlay metrology system will thus have to select another wavelength(s) for optimizing the overlay measurements.

As evidenced by FIG. 1C and FIG. 1D, material stack variations can require frequent overlay recipe optimization, where each time a material stack corresponding with an overlay target changes, the overlay recipe must be re-optimized to ensure minimal asymmetry-induced overlay error for the material stack. Each overlay recipe optimization process requires that the spectroscopic overlay metrology system re-evaluate all potential wavelengths having all potential polarizations, one-by-one as described in detail above, and then select a wavelength(s) having a polarization (s) for incident radiation that optimizes overlay measurements for an overlay target corresponding with the changed material stack. In implementations where material stacks corresponding with the overlay targets change enough on a per wafer basis, the spectroscopic overlay metrology system may be required to re-optimize the overlay recipe (and thus select a new wavelength of incident radiation) on a per wafer basis. Since the spectroscopic overlay metrology system is limited to acquiring overlay information for only one wavelength at a time, conventional overlay recipe optimization processes require significant measurement time, thereby significantly reducing throughput. The following discussion proposes a spectroscopic metrology system for addressing such issues.

Figure 2:
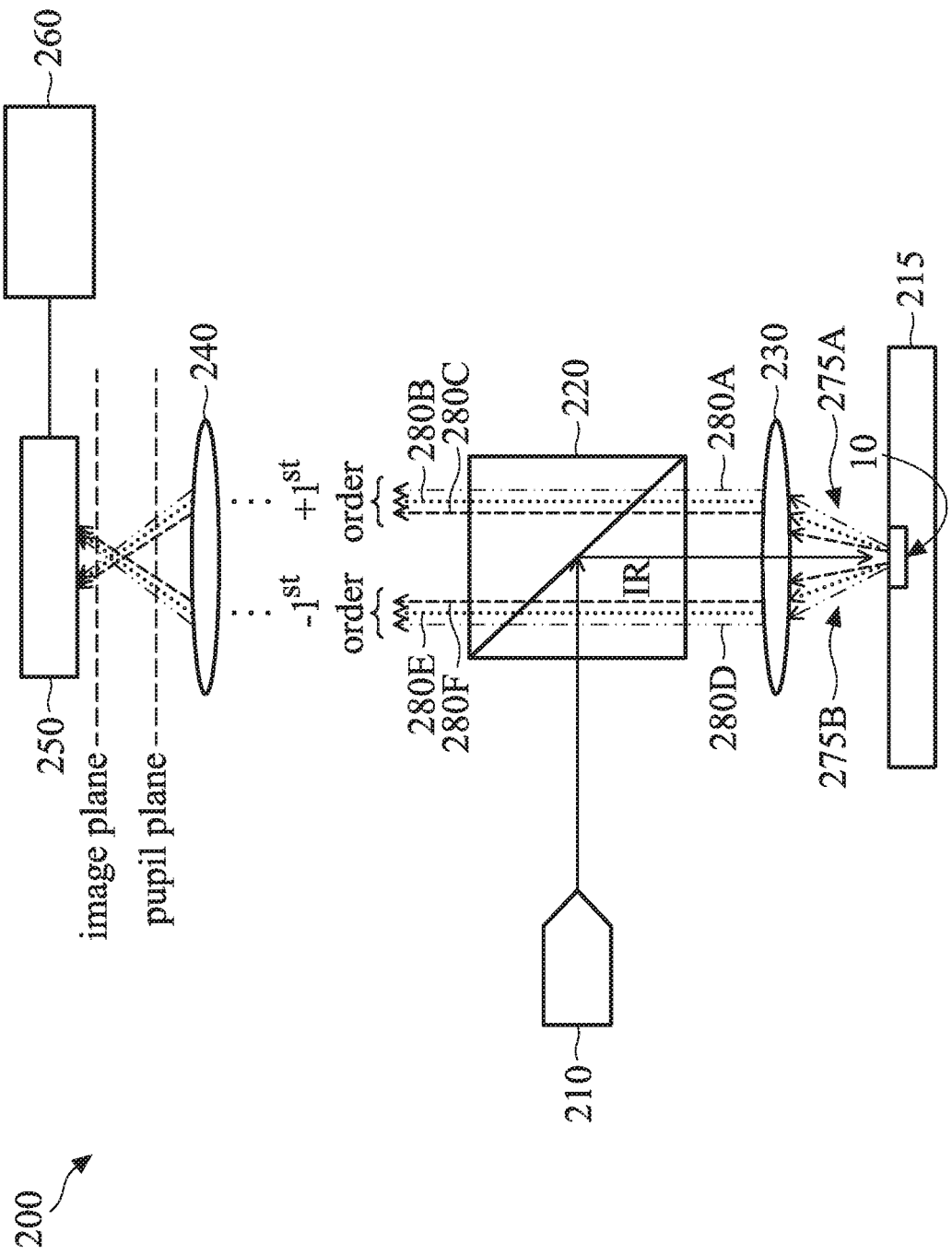
FIG. 2 is a simplified block diagram of a diffraction-based overlay (DBO) metrology system according to various aspects of the present disclosure.

FIG. 2 is a simplified block diagram of a diffraction-based overlay (DBO) metrology system 200 according to various aspects of the present disclosure. In FIG. 2, DBO metrology system 200 includes an illumination source 210 for illuminating a workpiece 215, a beam splitter 220, an imaging component 230, an imaging component 240, a spectroscopic sensor 250, and an overlay metrology module 260. In some implementations, DBO metrology system 200 is a stand-alone system. In some implementations, DBO metrology system 200 is included in a lithography system used for patterning workpieces, where DBO metrology system 200 can monitor overlay between patterned layers (for example, after a lithography process). FIG. 2 has been simplified for the sake of clarity to better understand the inventive concepts of the present disclosure. Additional features can be added in DBO metrology system 200, and some of the features described below can be replaced, modified, or eliminated for additional embodiments of DBO metrology system 200.

Illumination source 210 illuminates an overlay target, such as overlay target 10, of workpiece 215 (which can be disposed on stage (not shown) configured to position and/or align workpiece 215 within DBO metrology system 200). In the depicted embodiment, illumination source 210 is a broadband radiation source, which generally refers to a radiation source that includes radiation of more than one wavelength. In some implementations, the broadband radiation source includes radiation having wavelengths from about 350 nm to about 900 nm. For example, in some implementations, the broadband radiation source is a white light source. In some implementations, illumination source 210 generates the radiation from a laser source and/or a gas lamp source. In some implementations, DBO metrology system 200 further includes a filter (not shown) for modifying (for example, decreasing or increasing) an intensity of illumination source 210. In such implementations, the filter may be configured to modify individual wavelengths of radiation generated by illumination source 210, such that the wavelengths of radiation have a uniform intensity. In some implementations, the filter may be disposed between illumination source 210 and beam splitter 220, though the present disclosure contemplates the filter being located elsewhere within DBO metrology system 200.

Beam splitter 220 divides radiation from illumination source 210 into a plurality of radiation beams (collectively referred to as incident radiation IR), where incident radiation IR is focused onto workpiece 215 (in particular, onto overlay target 10) by an imaging component 230. In some implementations, imaging component 230 is an imaging optical system, such as an objective lens and/or objective lens system. The imaging optical system can include various mirrors, including refractive mirrors and/or reflective mirrors, depending on design requirements of DBO metrology system 200. In some implementations, beam splitter 220 reflects radiation from illumination source 210 about 90° through imaging component 230. In some implementations, beam splitter 220 may reflect about 50% of radiation from illumination source 210 and transmit about 50% of radiation from illumination source 210.

Incident radiation IR, which is a polychromatic beam, impinges overlay target 10, which produces a diffraction spectrum from incident radiation IR. In particular, overlay target 10 separates incident radiation IR into a plurality of diffracted beams, each of the diffracted beams corresponding with a respective wavelength of a respective diffraction order. In FIG. 2, the diffraction spectrum includes positive first ($+1^{st}$) order diffraction beams 275A and negative first order ($-1^{st}$) diffraction beams 275B for more than one wavelength of incident radiation IR. For example, $+1^{st}$ order diffraction beams 275A include diffracted beam 280A, diffracted beam 280B, and diffracted beam 280C having different wavelengths, and $-1^{st}$ order diffraction beams 275B include diffracted beam 280D, diffracted beam 280E, and diffracted beam 280F having different wavelengths. In some implementations, diffracted beam 280A and diffracted beam 280D have the same wavelength (for example, about 450 nm), diffracted beam 280B and diffracted beam 280E have the same wavelength (for example, about 550 nm), and diffracted beam 280C and diffracted beam 280F have the same wavelength (for example, about 700 nm). DBO metrology system 200 thus directly uses overlay target 10 (which is the sample to be analyzed for overlay information) to separate the diffraction spectrum into different wavelengths and different diffraction orders, such that no color filter (for example, an optical filter) is required for separating incident radiation IR and/or the diffraction spectrum into different wavelengths. Such increases intensity information that can be collected corresponding with the diffraction spectrum. Though not depicted, a diffraction spectrum having diffracted beams corresponding with different wavelengths (such as depicted in FIG. 2) is produced from each overlay pattern 12A-12D of overlay target 10. Further, though the diffraction spectrum is depicted with only the first order diffraction beams, the present disclosure contemplates embodiments where the diffraction spectrum includes higher order diffraction beams constructed similar to the first order diffraction beams. In some implementations, DBO metrology system 200 includes one or more polarizers for setting a polarization state of the diffraction spectrum. In some implementations, incident radiation IR and the diffraction spectrum are un-polarized. In some implementations, incident radiation IR is polarized (in a parallel polarization state, a perpendicular polarization state, or both), such that the diffraction spectrum is polarized according to the incident radiation. In some implementations, incident radiation IR is un-polarized, but the diffraction spectrum is polarized (in a parallel polarization state, a perpendicular polarization state, or both) before reaching spectroscopic sensor 250. In some implementations, DBO metrology system 200 is configured to produce diffraction spectrum having different wavelengths, where each different wavelength is further divided into the respective wavelength having different polarization states.

Diffraction spectrum produced by overlay target 10 from incident radiation IR is passed through imaging component 230 and/or beam splitter 220 and focused by an imaging component 240 onto spectroscopic sensor 250. In some implementations, imaging component 240 is an imaging optical system, such as an imaging lens and/or imaging lens system. The imaging optical system can include various mirrors, including refractive mirrors and/or reflective mirrors, depending on design requirements of DBO metrology system 200. In some implementations, imaging component 240 focuses the diffraction spectrum onto a pupil plane, at which spectroscopic sensor 250 is located. In some implementations, imaging component 240 focuses the diffraction spectrum onto an image plane, at which spectroscopic sensor 250 is located.

Spectroscopic sensor 250 detects the diffraction spectrum and collects intensity information associated with the diffraction spectrum, such that spectroscopic sensor 250 captures intensity of the diffraction spectrum as a function of wavelength with a single illumination of overlay target 10. In some implementations, spectroscopic sensor 250 includes an image sensor array having a plurality of pixels, where one or more pixels are assigned to collect intensity information from respective diffracted beams 280A-280F, such that each pixel collects intensity information from a diffracted beam of a particular wavelength and a particular diffraction order. In some implementations, the image sensor array includes a charged coupled device (CCD) sensor array or a complementary metal-oxide-semiconductor (MOS) sensor array. In some implementations, each pixel has a corresponding filter configured to allow a particular wavelength of a particular diffraction order to reach the pixel. For example, a first set of pixels may have a filter configured to allow diffracted beam 280A to reach the first set of pixels, a second set of pixels may have a filter configured to allow diffracted beam 280B to reach the second set of pixels, and so on for each of the diffracted beams in the diffraction spectrum for which DBO metrology system 200 is gathering overlay information. In some implementations, the filter is a multi-pole filter, though the present disclosure contemplates any type of filter configured to pass a diffracted beam of a particular wavelength and a particular diffraction order. In some implementations, DBO metrology system 200 is configured (for example, positioning of spectroscopic sensor 250, imaging component 240, and/or workpiece 215), such that each diffracted beam impinges spectroscopic sensor 250 at different locations, where each location corresponds with one or more pixels assigned to collecting intensity information for a diffracted beam of a particular wavelength and a particular diffraction order. Because the diffraction spectrum is separated by wavelength and diffraction order, spectroscopic sensor 250 can simultaneously analyze multiple wavelengths of multiple diffraction orders.

An overlay metrology module 260 is communicatively coupled with spectroscopic sensor 250, such that overlay metrology module 260 can generate overlay information from the intensity information associated with the diffraction spectrum collected by spectroscopic sensor 250. In some implementations, overlay metrology module 260 generates overlays corresponding with multiple wavelengths of incident radiation for multiple diffraction orders. For example, overlay metrology module 260 can calculate intensity differences between $+1^{st}$ order diffraction beams 275A and $-1^{st}$ order diffraction beams 275B (for example, between diffracted beam 280A and diffracted beam 280D), where each intensity difference corresponds with a measured overlay shift. In some implementations, overlay metrology module 260 generates overlay measurements, such as overlays (sometimes referred to as overlay errors), by calculating a difference between the measured overlay shifts and known overlay shifts, such as target bias +d and/or −d in an x-direction and a y-direction. In some implementations, based on the overlay measurements, overlay metrology module 260 analyzes various metrics for identifying overlay measurements with minimal (or no) asymmetry-induced overlay error, and then identifies a wavelength(s) for optimizing overlay measurements during IC fabrication. In some implementations, overlay metrology module 260 generates overlay information on a per wafer basis, such that overlay metrology module 260 generates an optimal overlay recipe (in particular, selecting an optimal wavelength(s) for performing overlay measurements) on a per wafer basis. In some implementations, the optimal overlay recipe defines a polarization state of the selected optimal wavelength(s). In some implementations, overlay metrology module 260 generates an optimal overlay recipe after a defined number of processes wafers or on a per lot basis. During IC fabrication, DBO metrology system 200 can then perform overlay measurements according to the optimal overlay recipe. For example, in some implementations, DBO metrology system 200 analyzes intensity information associated with only wavelength(s) selected by overlay metrology module 260 for optimizing overlay measurements. In some implementations, DBO metrology system 200 is configured to illuminate the overlay targets with incident radiation having only wavelength(s) selected by overlay metrology module 260

Figure 3:
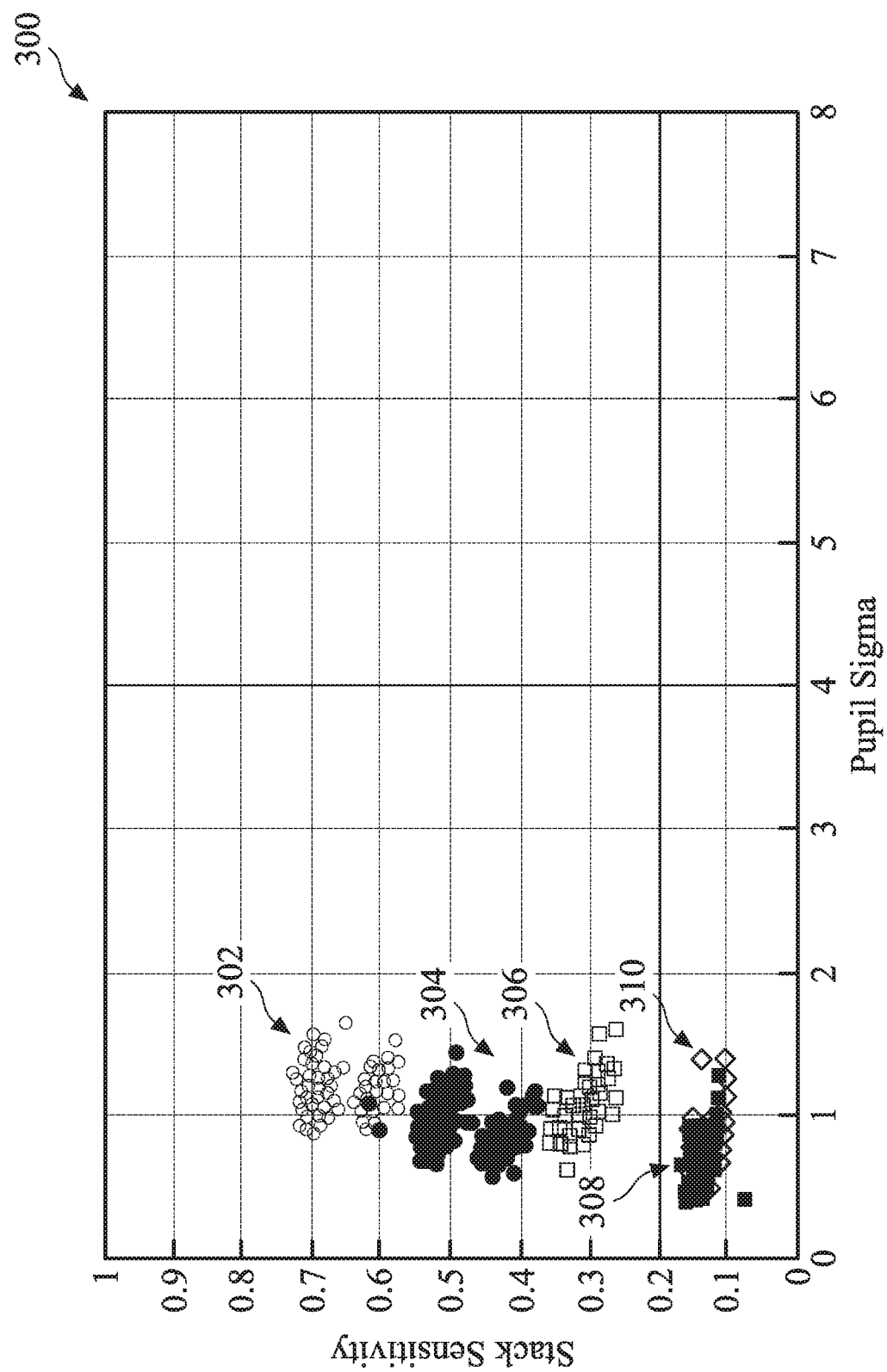
FIG. 3 is a simplified graph that can be generated by the DBO metrology system of FIG. 2, according to various aspects of the present disclosure.

In some implementations, overlay metrology module 260 generates and evaluates various knowledge performance indicators (KPIs) based on the intensity information and/or calculated overlays. FIG. 3 is a simplified graph 300 that can be generated by overlay metrology module 260 according to various aspects of the present disclosure. In FIG. 3, graph 300 illustrates stack sensitivity and pupil sigmas, each of which can be associated with a different overlay recipe for gathering overlay information from an overlay target (for example, overlay target 10), where each overlay recipe uses a different wavelength of incident radiation. A set of data points 302 corresponds with an overlay recipe using a first wavelength of incident radiation (for example, 500 nm having perpendicular polarization), a set of data points 304 corresponds with an overlay recipe using a second wavelength of incident radiation (for example, 500 nm having both perpendicular polarization and parallel polarization), a set of data points 306 corresponds with an overlay recipe using a third wavelength of incident radiation (for example, 500 nm having no polarization), a set of data points 308 corresponds with an overlay recipe using a fourth wavelength of incident radiation (for example, 425 nm having both perpendicular polarization and parallel polarization), and a set of data points 310 corresponds with an overlay recipe using a fifth wavelength of incident radiation (for example, 425 nm having no polarization). In implementations where a stack sensitivity of greater than about 0.2 is needed for optimizing overlay measurements, overlay metrology module 260 can quickly assess that the fourth wavelength and fifth wavelength will not work for optimizing overlay measurements. Overlay metrology module 260 can then evaluate stack sensitivity and/or other criteria corresponding with the first, second, and third wavelengths to select a best wavelength(s) for performing overlay measurements. In some implementations, where higher stack sensitivity leads to improved overlay measurement detectability, overlay metrology module 260 selects the first wavelength for an optimized overlay recipe. In some implementations, where too high a stack sensitivity introduces instability that can skew overlay measurements, overlay metrology module 260 selects the second wavelength and/or the third wavelength for an optimized overlay recipe. Because DBO metrology system 200 acquires intensity information for the various wavelengths in a single shot (in other words, a single illumination of overlay target 10), overlay metrology module 260 can quickly generate overlay information and select optimal wavelengths for incident radiation IR based on the overlay information.

Figure 4:
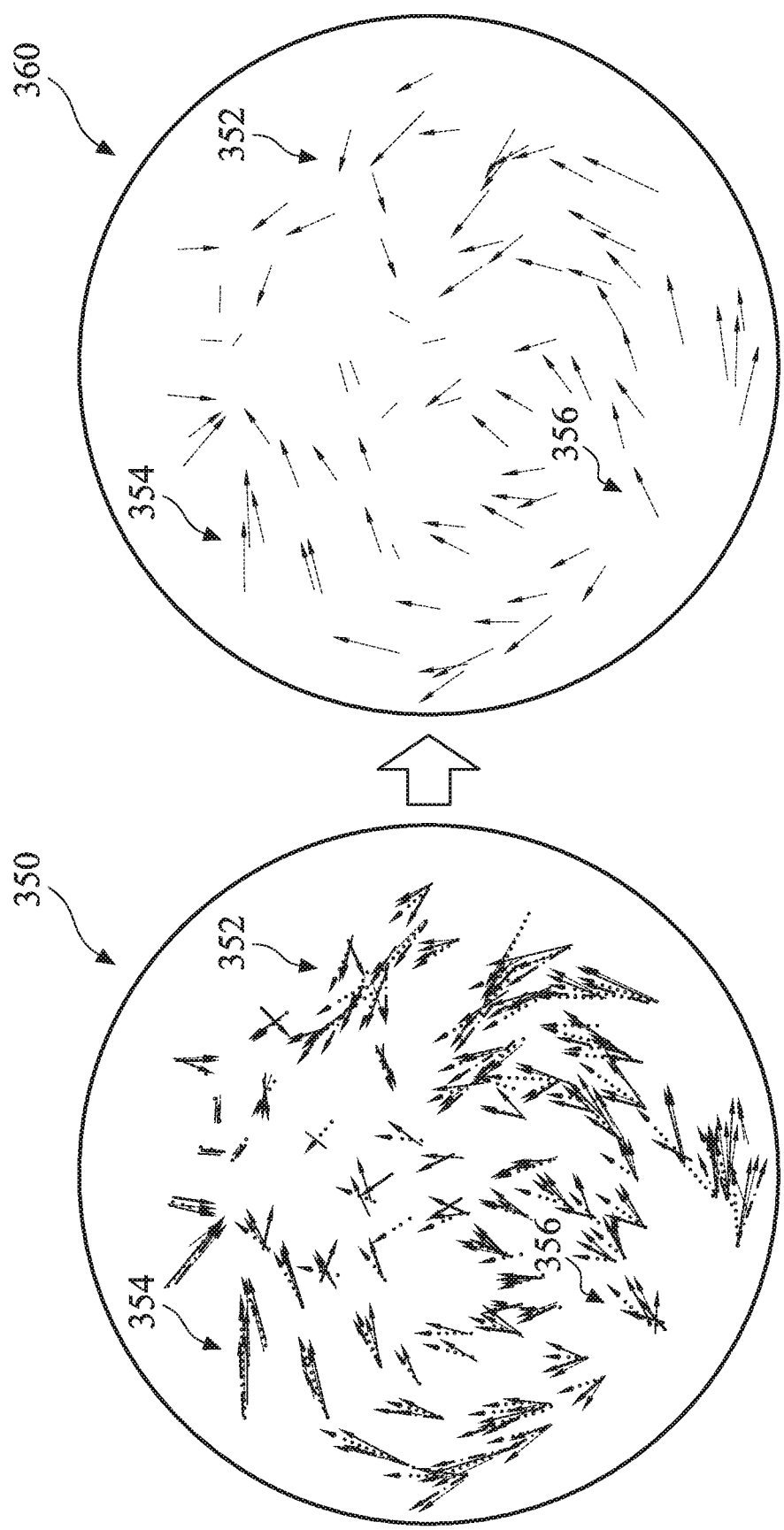
FIG. 4 is a simplified overlay maps that can be generated by the DBO metrology system of FIG. 2 according to various aspects of the present disclosure.

In some implementations, overlay metrology module 260 generates and evaluates a golden majority overlay map based on the intensity information and/or calculated overlays. FIG. 4 is a simplified schematic depiction of overlay maps, which can be generated by overlay metrology module 260, according to various aspects of the present disclosure. An overlay map 350 schematically depicts overlays obtained using different overlay recipes at different overlay areas of a workpiece (for example, a wafer), where each overlay recipe uses a different wavelength of incident radiation. Each overlay area (such as an overlay area 352, an overlay area 354, and an overlay area 356) includes various vectors, each vector representing a direction and a magnitude of an overlay for a respective wavelength of incident radiation. Overlay metrology module 260 calculated the overlays based on intensity information acquired for different wavelengths of incident radiation (for example, from about 400 nm to about 900 nm) in a single shot, where the overlays include contributions from asymmetry-induced overlay error. In other words, DBO metrology system 200 illuminated each overlay target corresponding with each overlay area a single time with a polychromatic beam, where the overlay grating produced a diffraction spectrum that separates the multiple wavelengths for analysis by overlay metrology module 260. In FIG. 4, overlay metrology module 260 can analyze the various overlay vectors at each overlay area to generate a golden overlay map 360 in real-time. Golden overlay map 360 includes a single vector for each overlay area, where the single vector represents a direction and a magnitude of an overlay for a wavelength of incident radiation that minimizes (or eliminates) asymmetry-induced overlay error for its respective overlay area. A set of overlay conditions may also be defined with golden overlay map 360. During IC fabrication, at each overlay area, DBO metrology system 200 can then perform overlay measurements by illuminating overlay targets with wavelengths specified in golden overlay map 360 and/or analyzing intensity information associated with wavelengths specified in golden overlay map 360 (for example, where overlay targets are illuminated with a polychromatic beam).

Figure 5:
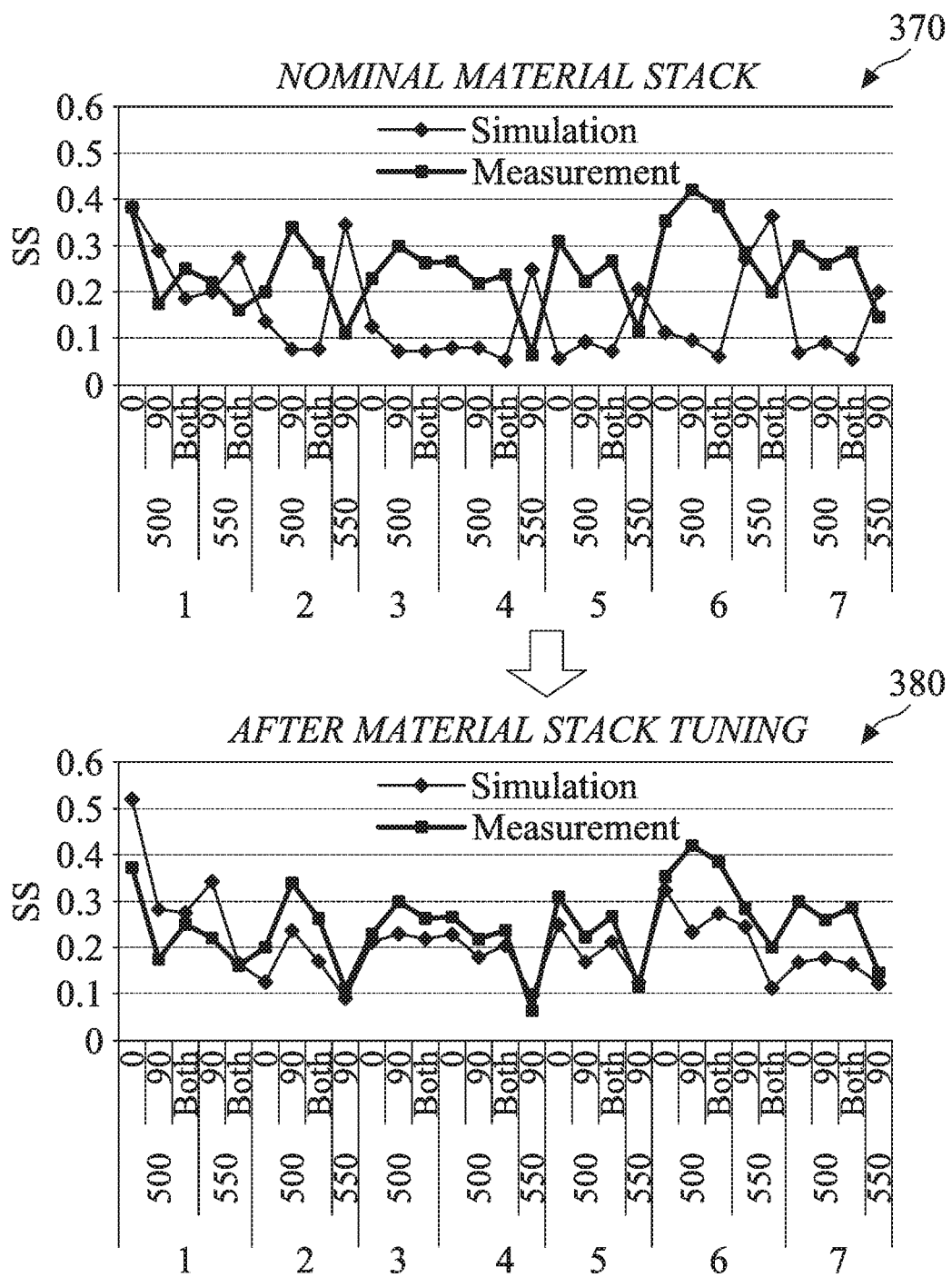
FIG. 5 includes simplified graphs illustrating stack sensitivity as a function of a wavelength for different wafers, which can be generated by overlay the DBO metrology system of FIG. 2, according to various aspects of the present disclosure.

In some implementations, overlay metrology module 260 is used for constructing (tuning) a material stack for facilitating accurate overlay measurements and/or accurate material stack predictions (simulations). FIG. 5 includes simplified graphs illustrating stack sensitivity as a function of a wavelength for different wafers, which can be generated by overlay metrology module 260, according to various aspects of the present disclosure. For example, a graph 370 and a graph 380 each illustrate simulated stack sensitivity and measured stack sensitivity as a function of different wavelengths of incident radiation on various wafers 1-7. Overlay metrology module 260 can generate values for measured stack sensitivity by analyzing intensity information received from spectroscopic sensor 250 after an overlay target of each wafer is illuminated with two different wavelengths (here, 500 nm and 550 nm) in a single shot for each polarization condition (for example, a parallel polarization state (0), a perpendicular polarization state (90), and both a parallel and perpendicular polarization state (both)). In some implementations, DBO metrology system 200 may gather the intensity information in three different shots—one for each polarization state of the wavelengths of incident radiation. In some implementations, DBO metrology system 200 may gather the intensity information in a single shot by further separating the diffraction spectrum into the different wavelengths having the different polarization states. Based on historical overlay information and/or current overlay information, overlay metrology module 260 generates values for simulated stack sensitivity by simulating illumination of an overlay target of each wafer with the two different wavelengths having various polarization states and generating intensity information corresponding with simulated diffraction spectrum produced by the overlay targets from the various incident radiations. In FIG. 5, graph 370 indicates that simulated stack sensitivity varies from measured stack sensitivity for a material stack, quite significantly for some wafers. To improve such modeling, a graph 380 evaluates simulated and measured stack sensitivity after tuning the material stack. For example, in some implementations, a thickness of various layers of the material stack (such as first patterned layer 20, second patterned layer 25, and/or material layer 30 (including material layers thereof)) can be adjusted to bring the simulated stack sensitivity observed at each wavelength condition closer to the measured stack sensitivity at each wavelength condition, as depicted in graph 380. Such modifications can be considered when simulating stack sensitivity for subsequently processed wafers, such that a more accurate material stack model can be built for simulating and estimating overlay information. In some implementations, overlay metrology module 260 can derive actual material stack characteristics and/or material stack models by fitting actual overlay information (such as stack sensitivity) to simulated overlay information. DBO metrology system 200 can thus provide quick, robust generation of such material stack models.

Turning again to FIG. 2, overlay metrology module 260 can include a processor that is communicatively coupled to a system memory, a mass storage device, and a communication module. The system memory provides the processor with non-transitory, computer-readable storage to facilitate execution of computer instructions by the processor. Examples of the system memory include random access memory (RAM) devices, such as dynamic RAM (DRAM), synchronous DRAM (SDRAM), solid state memory devices, and/or a variety of other memory devices. Computer programs, instructions, and data are stored on the mass storage device. Examples of the mass storage device include hard discs, optical disks, magneto-optical discs, solid-state storage devices, and/or a variety of other mass storage devices. The communication module is operable to communicate information with various components of IC manufacturing entities, such as a design house, a mask house, and/or an IC fab of an IC manufacturing system. In some implementations, the communication module is operable to communicate information to a lithography system used for patterning IC layers. The communication module includes Ethernet cards, 802.11 WiFi devices, cellular data radios, and/or other communication devices for facilitating communication of overlay metrology module 260 with other entities.

By irradiating an overlay target with a polychromatic beam and using the overlay target to separate the polychromatic beam into a plurality of diffracted beams corresponding with different wavelengths and different diffraction orders, DBO metrology system 200 can simultaneously measure and/or evaluate multiple wavelengths with a single shot of radiation, facilitating robust determination of optimal wavelengths that minimize (or eliminate) asymmetry-induced overlay error. By using the overlay target for separating the diffraction spectrum into various wavelengths, DBO metrology system 200 can improve overlay assessment with minimal hardware modifications and/or expense. Further, simultaneously collecting intensity information associated with the diffraction spectrum also significantly decreases measurement time, thereby significantly improving throughput and facilitating quick real-time overlay assessments. The improved throughput prevents DBO metrology system 200 from being overwhelmed by the ever increasing overlay recipe optimizations required for advanced technology nodes, which exhibit less tolerance for error and more sensitivity to material stack variations. DBO metrology system 200 thus provides a robust overlay metrology platform that provides numerous benefits over conventional spectroscopic overlay metrology systems. Different embodiments disclosed herein offer different advantages and no particular advantage is necessarily required in all embodiments.

Figure 6:
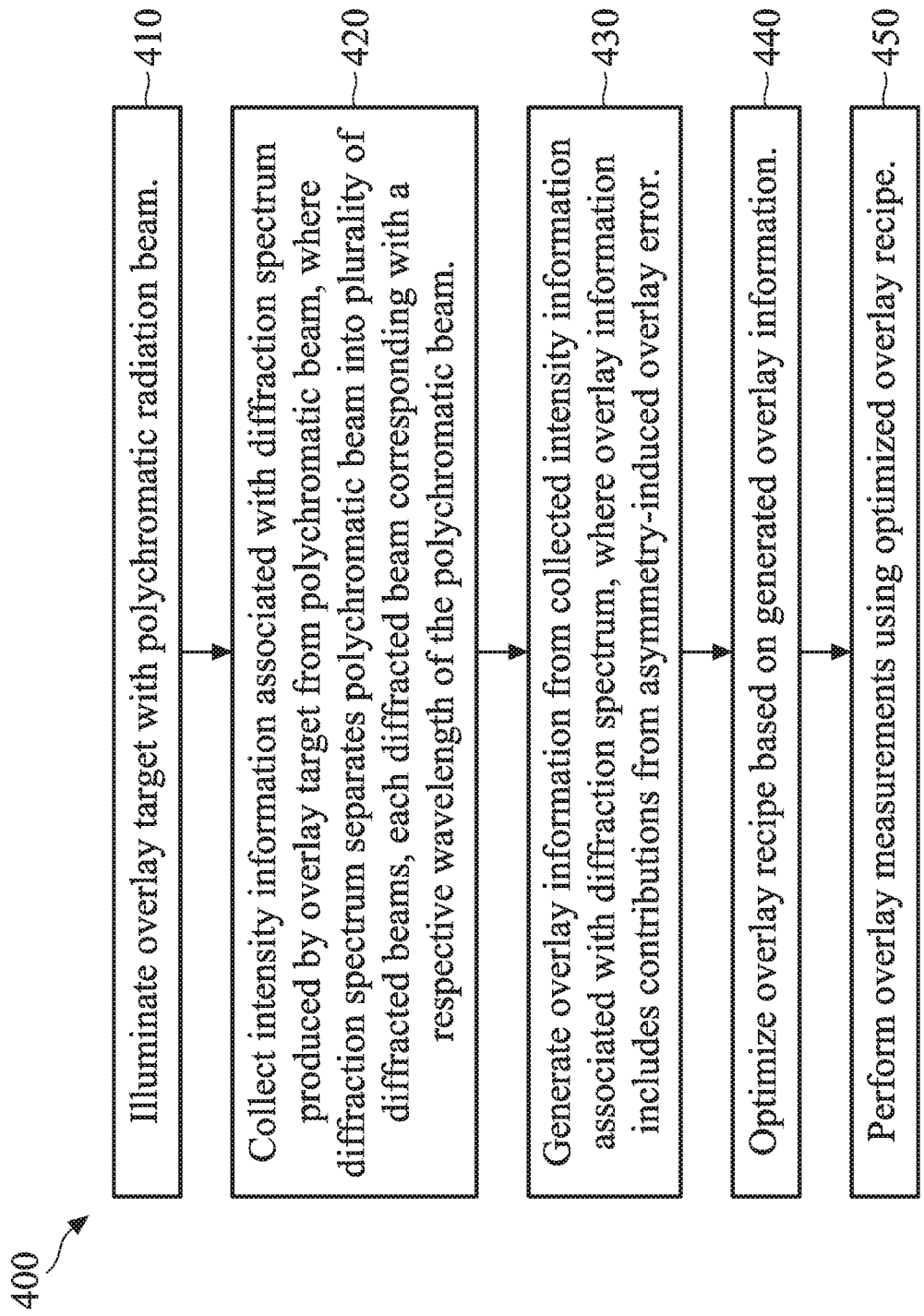
FIG. 6 is a flowchart of an overlay metrology method, which can be implemented by the DBO metrology system of FIG. 2, according to various aspects of the present disclosure.

FIG. 6 is a flowchart of an overlay metrology method 400, which can be implemented by DBO metrology system 200, according to various aspects of the present disclosure. At block 410, an overlay target is illuminated with a polychromatic beam. At block 420, intensity information associated with a diffraction spectrum produced by the overlay grating target from the polychromatic beam is collected. The diffraction spectrum separates the polychromatic beam into a plurality of diffracted beams, each of the plurality of diffracted beams corresponding with a respective wavelength of the polychromatic beam. At block 430, overlay information is generated from the collected intensity information associated with the diffraction spectrum, wherein the overlay information includes contributions from asymmetry-induced overlay error. At block 440, an overlay recipe is optimized based on the generated overlay information. For example, a wavelength of incident radiation is selected for use in subsequent overlay analysis that minimizes (or eliminates) asymmetry-induced overlay error. At block 450, method 400 may continue with performing overlay measurements using the optimized recipe. Various details associated with each block are described in detail herein. Additional steps can be provided before, during, and after method 400, and some of the steps described can be moved, replaced, or eliminated for additional embodiments of method 400.

The present disclosure provides for various embodiments. An exemplary method includes illuminating an overlay grating target with a polychromatic beam and collecting intensity information associated with a diffraction spectrum produced by the overlay grating target from the polychromatic beam. The diffraction spectrum separates the polychromatic beam into a plurality of diffracted beams, each of the plurality of diffracted beams corresponding with a respective wavelength of the polychromatic beam. The method further includes generating overlay information from the collected intensity information associated with the diffraction spectrum, wherein the overlay information includes contributions from asymmetry-induced overlay error. In some implementations, the method further includes selecting a wavelength of incident radiation for use in subsequent overlay analysis based on the generated overlay information. In some implementations, collecting intensity information associated with the diffraction spectrum includes collecting positive first order diffraction intensities from the diffraction spectrum and collecting negative first order diffraction intensities from the diffraction spectrum. The positive first order diffraction intensities correspond with more than one wavelength of the polychromatic beam, and the negative first order diffraction intensities correspond with more than one wavelength of the polychromatic beam.

In some implementations, generating the overlay information from the collected intensity information associated with the diffraction spectrum includes calculating an overlay corresponding with more than one wavelength of the polychromatic beam. In some implementations, the method further includes fabricating the overlay target on a workpiece, wherein the overlay target corresponds with patterned layers used to form a device feature on the workpiece. In some implementations, the overlay target is a first overlay target on a first workpiece, and the method further includes illuminating a second overlay target on a second workpiece with the selected wavelength of incident radiation to gather overlay information from the second overlay target. In some implementations, the method further includes collecting the intensity information in a pupil plane. In some implementations, the method further includes collecting the intensity information in an image plane.

In some implementations, the method further includes generating a material stack model describing characteristics of layers forming the overlay target, wherein the material stack model is used for simulating the illuminating and the collecting to generate simulated overlay information; and adjusting the material stack model by comparing the simulated overlay information to the generated overlay information. In some implementations, the method further includes adjusting characteristics of layers used for fabricating the overlay grating target based on the simulated overlay information and the generated overlay information.

Another exemplary method includes generating a diffraction spectrum by an overlay target from incident radiation having more than one wavelength. The diffraction spectrum includes a plurality of positive ordered diffracted beams and a plurality of negative ordered diffracted beams that are separated by wavelength, such that the diffraction spectrum includes more than one wavelength of a positive order and a negative order. In some implementations, the method further includes collecting intensity information associated with the diffraction spectrum generated by the overlay target from the incident radiation. In some implementations, the method further includes generating overlay information from the collected intensity information associated with the diffraction spectrum, wherein the overlay information includes contributions from asymmetry-induced overlay error.

In some implementations, generating the diffraction spectrum by the overlay target includes illuminating the overlay target with the incident radiation a single time. In some implementations, the method further includes optimizing an overlay recipe based on the generated overlay information. In some implementations, optimizing the overlay recipe includes selecting a wavelength of incident radiation for use in subsequent overlay analysis. In some implementations, selecting the wavelength further includes selecting a polarization state of the wavelength. In some implementations, the method further includes generating a material stack model describing characteristics of layers forming the overlay target, wherein the material stack model is used for simulating the illuminating and the collecting to generate simulated overlay information; and adjusting the material stack model by comparing the simulated overlay information to the generated overlay information.

An exemplary overlay metrology system includes a polychromatic light source configured to generate a polychromatic beam and a spectroscopic sensor system. The spectroscopic sensor system is configured to collect intensity information associated with a diffraction spectrum produced by an overlay grating target illuminated with the polychromatic beam. The diffraction spectrum separates the polychromatic beam into a plurality of diffracted beams, each of the plurality of diffracted beams corresponding with a respective wavelength. The spectroscopic sensor system is further configured to generate overlay information from the collected intensity information associated with the diffraction spectrum, wherein the overlay information includes contributions from asymmetry-induced overlay error.

In some implementations, the polychromatic light source is a white light source. In some implementations, the spectroscopic sensor system includes an image sensor array configured to collect the intensity information associated with the diffraction spectrum. In some implementations, each pixel of the image sensor array is assigned to collect intensity information of a particular wavelength of a particular diffraction order from the plurality of diffracted beams. In some implementations, the overlay grating target includes a first periodic structure and a second periodic structure disposed over the first periodic structure, wherein the first periodic structure is offset form the second periodic structure by a pre-defined offset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   illuminating an overlay grating target with a polychromatic beam, wherein the overlay grating target produces a diffraction spectrum by separating the polychromatic beam into diffracted beams corresponding with different wavelengths;
   collecting intensity information associated with the diffraction spectrum produced by the overlay grating target from the polychromatic beam;
   generating overlay information from the intensity information associated with the diffraction spectrum, wherein the overlay information includes contributions from asymmetry-induced overlay error;

generating a material stack model describing characteristics of layers forming the overlay grating target, wherein the material stack model is used for simulating the illuminating and the collecting to generate simulated overlay information; and adjusting the material stack model by comparing the simulated overlay information to the overlay information.

2. The method of claim 1, wherein:

the collecting the intensity information includes simultaneously and separately collecting and analyzing positive first order diffraction intensities for different wavelengths from the diffraction spectrum.

3. The method of claim 2, wherein:

the collecting the intensity information wavelength further includes simultaneously and separately collecting and analyzing negative first order diffraction intensities for different wavelengths from the diffraction spectrum.

4. The method of claim 1, further comprising fabricating the overlay grating target on a workpiece, wherein the overlay grating target corresponds with patterned layers used to form a device feature on the workpiece.

5. The method of claim 4, wherein the overlay grating target is a first overlay grating target on a first workpiece, the method further comprising illuminating a second overlay grating target on a second workpiece with incident radiation to gather overlay information from the second overlay grating target, wherein a wavelength of the incident radiation is selected based on the overlay information.

6. The method of claim 1, further comprising collecting the intensity information in a pupil plane.

7. The method of claim 1, further comprising collecting the intensity information in an image plane.

8. The method of claim 1, further comprising adjusting characteristics of layers used for fabricating the overlay grating target based on the simulated overlay information and the overlay information.

9. A method comprising generating a diffraction spectrum by an overlay target from a single shot of incident radiation having more than one wavelength, wherein the diffraction spectrum includes a first plurality of positive order diffracted beams separated by wavelength and a second plurality of negative order diffracted beams separated by wavelength, such that each of the first plurality of positive order diffracted beams has a respective wavelength of a positive order and each of the second plurality of negative order diffracted beams has a respective wavelength of a negative order;

simultaneously and separately collecting intensity information by wavelength for each of the first plurality of positive order diffracted beams and each of the second plurality of negative order diffracted beams of the diffraction spectrum generated by the overlay target from the single shot of incident radiation having more than one wavelength;

generating overlay information from the intensity information associated with the diffraction spectrum, wherein the overlay information includes contributions from asymmetry-induced overlay error;

generating a material stack model describing characteristics of layers forming the overlay target, wherein the material stack model is used for simulating the illuminating and the collecting to generate simulated overlay information; and adjusting the material stack model by comparing the simulated overlay information to the overlay information.

10. The method of claim 9, wherein the overlay information is generated after illuminating the overlay target with the single shot of incident radiation having more than one wavelength only once.

11. The method of claim 9, further comprising optimizing an overlay recipe based on the overlay information.

12. The method of claim 11, wherein the optimizing the overlay recipe includes selecting a wavelength of incident radiation for use in subsequent overlay analysis.

13. The method of claim 12, wherein the selecting the wavelength further includes selecting a polarization state of the wavelength.

14. The method of claim 9, wherein the comparing the simulated overlay information to the overlay information includes evaluating stack sensitivity as a function of wavelength of incident radiation.

15. An overlay metrology system comprising:

a polychromatic light source for illuminating an overlay grating target with a polychromatic beam, wherein the overlay grating target produces a diffraction spectrum by separating the polychromatic beam into diffracted beams corresponding with different wavelengths, wherein the diffracted beams corresponding with the different wavelengths are of the same diffraction order; and a spectroscopic sensor system configured to:

simultaneously and separately collect intensity information by wavelength for the diffracted beams corresponding with the different wavelengths from the diffraction spectrum produced by the overlay grating target from the polychromatic beam, simultaneously and separately analyze intensity information by wavelength for the diffracted beams corresponding with the different wavelengths from the diffraction spectrum produced by the overlay grating target from the polychromatic beam, generate overlay information from the intensity information associated with the diffraction spectrum, wherein the overlay information includes contributions from asymmetry-induced overlay error, generate a material stack model describing characteristics of layers forming the overlay grating target, wherein the material stack model is used for simulating the illuminating and the collecting to generate simulated overlay information, and adjust the material stack model by comparing the simulated overlay information to the overlay information.

16. The overlay metrology system of claim 15, wherein the polychromatic light source is a white light source.

17. The overlay metrology system of claim 15, wherein the spectroscopic sensor system includes an image sensor array configured to collect the intensity information associated with the diffraction spectrum by wavelength.

18. The overlay metrology system of claim 17, wherein each pixel of the image sensor array is assigned to collect intensity information of a particular wavelength of a particular diffraction order from the diffracted beams.

19. The overlay metrology system of claim 15, wherein the overlay grating target includes a first periodic structure and a second periodic structure disposed over the first periodic structure, wherein the first periodic structure is offset from the second periodic structure by a pre-defined offset.

\* \* \* \* \*